(12) United States Patent
Heide et al.

(10) Patent No.: US 9,084,286 B2
(45) Date of Patent: Jul. 14, 2015

(54) FRONT END MODULE AND METHOD OF OPERATION IN DIFFERENT CIRCUIT ENVIRONMENTS

(75) Inventors: Patric Heide, Vaterstetten (DE); Alexander Chernyakov, Munich (DE); Peter Stoehr, Munich (DE); Kostyantyn Markov, Munich (DE); Michael Schmachtl, Olching (DE); Volodymyr Novgorodov, Munich (DE); Peter Hagn, Finsing (DE); Christian Block, Stainz (AT); Stefan Freisleben, Neubiberg (DE)

(73) Assignee: EPCOS AG, Munich (DE)

( * ) Notice: Subject to any disclaimer, the term of this patent is extended or adjusted under 35 U.S.C. 154(b) by 412 days.

(21) Appl. No.: 13/636,270

(22) PCT Filed: Mar. 3, 2011

(86) PCT No.: PCT/EP2011/053206
§ 371 (c)(1),
(2), (4) Date: Apr. 10, 2013

(87) PCT Pub. No.: WO2011/117053
PCT Pub. Date: Sep. 29, 2011

(65) Prior Publication Data
US 2013/0190040 A1    Jul. 25, 2013

(30) Foreign Application Priority Data

Mar. 24, 2010 (DE) .......................... 10 2010 012603

(51) Int. Cl.
*H04M 1/00* (2006.01)
*H04W 88/06* (2009.01)
*H04B 1/00* (2006.01)
(Continued)

(52) U.S. Cl.
CPC ............ *H04W 88/06* (2013.01); *H04B 1/0057* (2013.01); *H05K 1/029* (2013.01); *H05K 1/112* (2013.01); *H05K 2201/10212* (2013.01); *H05K 2203/173* (2013.01)

(58) Field of Classification Search
CPC ....................................................... H04B 1/0057
USPC ............... 455/552.1, 78, 80, 82; 343/700 MS
See application file for complete search history.

(56) References Cited

U.S. PATENT DOCUMENTS 4,632,571 A    12/1986  Morata
6,320,548 B1 *  11/2001  Harrell et al. .......... 343/700 MS
(Continued)

FOREIGN PATENT DOCUMENTS

DE    1 902 431 A1    8/1970
DE    2 243 219 A1    3/1973
(Continued)

OTHER PUBLICATIONS

Orlenko, D., et al., "Novel High-Rejection LTCC Diplexers for Dual-Band WLAN Applications," IEEE MTT-S International Microwave Symposium Digest, Jun. 12-17, 2005, 4 pages.

*Primary Examiner* — Sanh Phu
(74) *Attorney, Agent, or Firm* — Slater & Matsil, L.L.P.

(57) ABSTRACT

A front end module has two signal paths for operation in two different frequency ranges which can be operated both with one antenna in the multiplex operating mode and with two antennas in a second operating mode. The respective operating mode is actuated via corresponding contact being made with the module substrate, and therefore by the user.

18 Claims, 3 Drawing Sheets

(51) Int. Cl.
*H05K 1/02* (2006.01)
*H05K 1/11* (2006.01)

(56) References Cited

U.S. PATENT DOCUMENTS

| | | | |
|---|---|---|---|
| 6,560,443 | B1 | 5/2003 | Vaisanen et al. |
| 7,868,766 | B2 * | 1/2011 | Gengel et al. .............. 340/572.7 |
| 8,130,787 | B2 | 3/2012 | Hagiwara et al. |
| 2001/0054981 | A1 | 12/2001 | Boyle |
| 2004/0212544 | A1 * | 10/2004 | Pennaz et al. ................ 343/795 |
| 2006/0139220 | A1 | 6/2006 | Hirota et al. |
| 2007/0075803 | A1 | 4/2007 | Kemmochi et al. |
| 2008/0102760 | A1 | 5/2008 | McConnell et al. |
| 2009/0009406 | A1 * | 1/2009 | Chu et al. ..................... 343/702 |
| 2010/0051339 | A1 | 3/2010 | Ou et al. |
| 2011/0169702 | A1 * | 7/2011 | Wendisch et al. ............. 343/702 |

FOREIGN PATENT DOCUMENTS

| | | |
|---|---|---|
| EP | 0 193 045 A1 | 9/1986 |
| JP | 200124579 A | 1/2001 |
| JP | 20029679 A | 1/2002 |
| JP | 2003536338 A | 12/2003 |
| JP | 2009290896 A | 12/2009 |
| WO | WO 98/44768 A1 | 10/1998 |

* cited by examiner

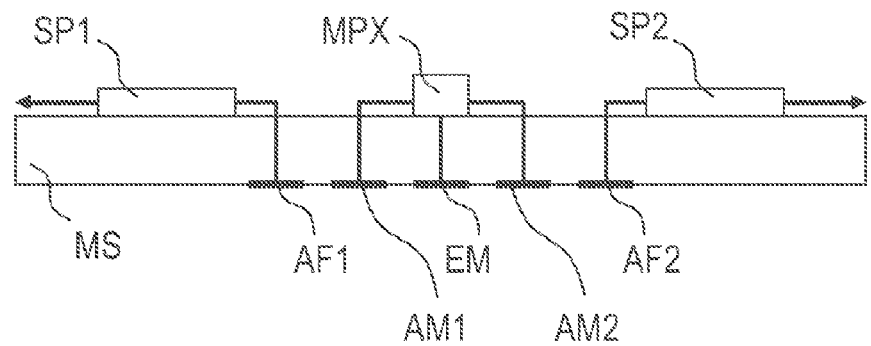
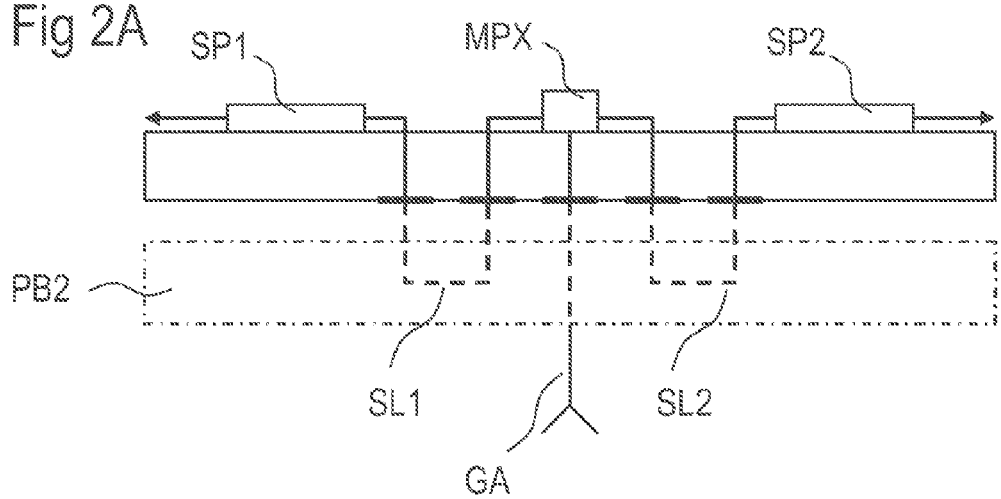
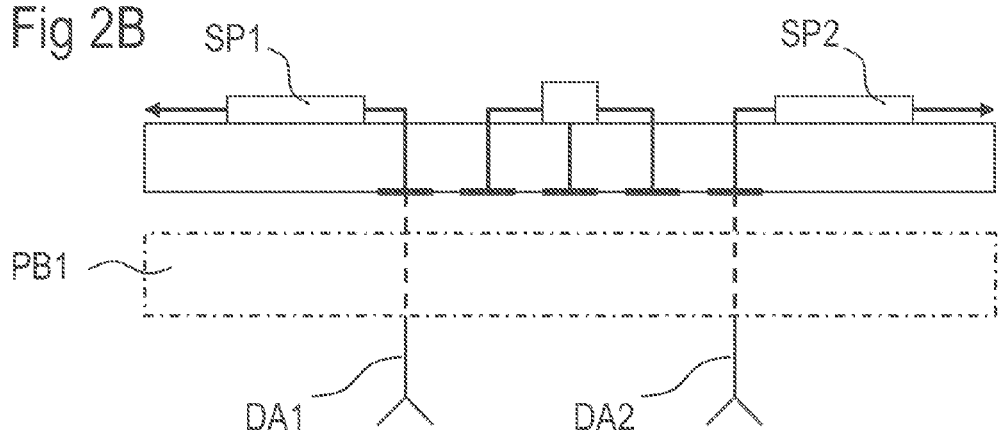

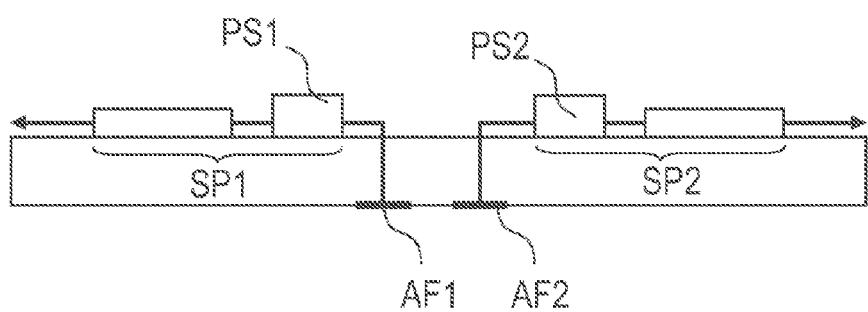
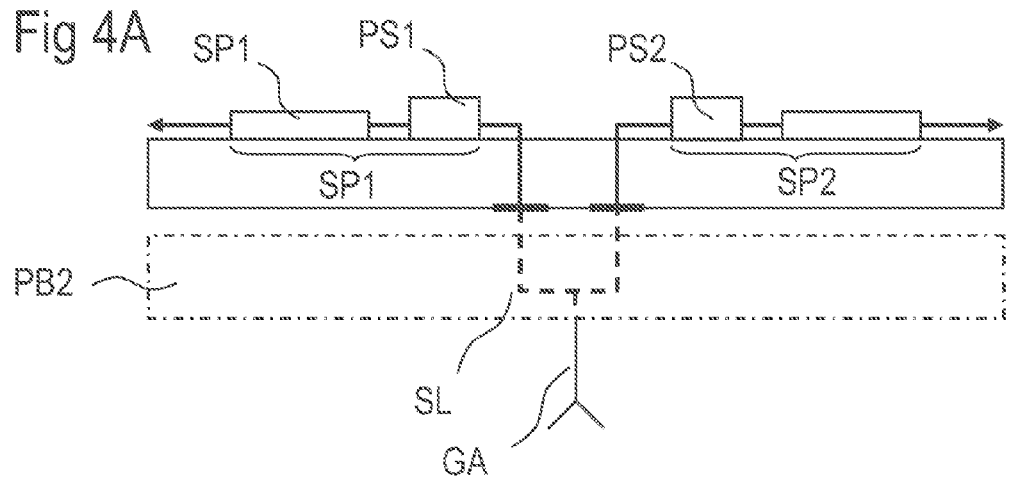
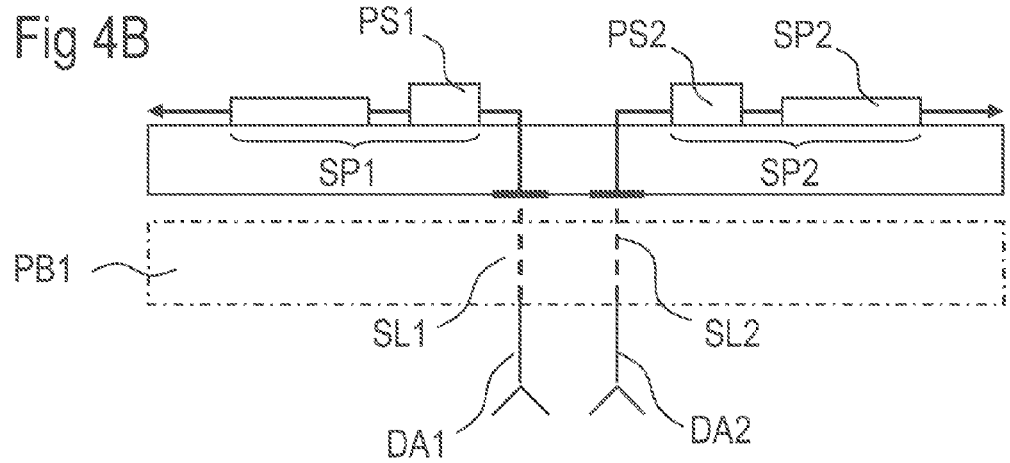

FRONT END MODULE AND METHOD OF OPERATION IN DIFFERENT CIRCUIT ENVIRONMENTS

This patent application is a national phase filing under section 371 of PCT/EP2011/053206, filed Mar. 3, 2011, which claims the priority of German patent application 10 2010 012 603.9, filed Mar. 24, 2010, each of which is incorporated herein by reference in its entirety.

TECHNICAL FIELD

The invention relates to a front end module, which is designed to transmit and/or receive in two different frequency ranges of wireless communication systems and enables a multiplex operating mode.

BACKGROUND

In cell phones, complementary wireless solutions are becoming an increasingly important factor in determining the attractiveness of the cell phone. Complementary solutions of this type, which are also referred to as "wireless connectivity," are under particular cost pressure, however, because the cell phone manufacturers wish to implement them as an add-on service as cheaply as possible. Therefore module solutions are sought that can be attached to existing platforms of the widest possible variety of cell phones.

Economic solutions require further miniaturization of these modules, which are then meant to be able to handle a plurality of wireless standards, in particular those standards for what is known as "near-field communication," such as WLAN and Bluetooth, or for signals transmitted by satellites or central transmitters such as VHF radio and GPS. It is desirable to integrate all these standards in a common module.

A module that is designed for different platforms must also take into account the fact that different platforms use different antenna designs and in particular different numbers of antennas.

SUMMARY OF THE INVENTION

In one aspect, the present invention defines a front end module in particular for "wireless connectivity" which can be used easily in a variable manner on different platforms having different antenna designs.

A front end module is defined that comprises at least a first signal path and a second signal path. A first signal path is operated in a first frequency range, and a second signal path in a second frequency range. Each path connects an antenna input to a signal-path output.

The signal paths are implemented on or in a module substrate, which comprises on its underside contact surfaces for connecting to a circuit environment. Each antenna input of the two signal paths is connected to one of these contact surfaces in each case. In a first operating mode, the front end module therefore provides the facility to connect each signal path individually to a dedicated diversity antenna via the contact surface connected to the antenna input.

The front end module is additionally designed, however, to work with just one shared antenna in a second operating mode that enables a multiplex operating mode. For this purpose, a connection facility for the multiplex operating mode is provided in and on the module substrate, and likewise corresponding contact surfaces, via which the two signal paths can be connected to the shared antenna.

The proposed front end module therefore enables in the first operating mode a mutually independent operation of the two signal paths via separate diversity antennas, one connected to each signal path. It additionally enables a multiplex operating mode via a shared antenna, which in particular while operating in receive mode assigns signals according to frequency to the relevant signal path by means of the multiplex operating mode.

The different operating modes are implemented by appropriate connection of the contact surfaces to the circuit environment and hence lie entirely within the discretion of the user of the front end module. The user can then integrate the module in the user's own circuit environment. Thus the module can be used flexibly and it is not necessary to provide different modules for different circuit environments. The second additional operating mode can be implemented by simple means according to the invention and costs only marginally more than a solution having just one operating mode.

The front end module can also be designed as an SiP (SiP=System in Package), in which a plurality of chip components are implemented on a shared substrate or at least in a shared package, which on its underside comprises the relevant terminals for the components contained therein.

In one exemplary embodiment, a multiplexer circuit is implemented on or in the module substrate. This multiplexer circuit comprises a multiplexer input and a first output and a second output. These three terminals are each connected to a separate contact surface on the underside of the module substrate. Together with the first and second contact surfaces of the first operating mode, the module substrate now comprises at least five contact surfaces.

The multiplex operating mode can now be achieved by suitable connection of these contact surfaces, namely by the first contact surface being connected to the contact surface of the first output, the second contact surface being connected to the contact surface of the second output, and the contact surface of the multiplexer input being connected to a shared antenna.

The connection of two contact surfaces on the underside of the module substrate is made in the circuit environment, i.e., on the part of the user, and is implemented by appropriate RF lines.

The multiplexer circuit can be embodied as a frequency splitter, which splits signals received via the antenna according to their frequency and assigns them to one of the two outputs, which can then be connected to the appropriate signal path by the user of the front end module.

In a simple embodiment, the multiplex circuit can be composed of a high-pass filter and a low-pass filter, wherein the high-pass filter lets through signals from that frequency range having the higher frequency while the low-pass filter lets through signals from that frequency range having the lower frequency.

In a further exemplary embodiment, no additional multiplexer is needed. Instead, the two signal paths are then connected on the antenna side to a phase matching circuit. The effect of this circuit is that in the signal path concerned, the phase of an RF signal that has a frequency lying in the respective other frequency range is rotated to "Open." Hence the phase matching circuit blocks the signal path to signals of the other frequency range in each case. Thus, in this embodiment it is possible to connect the two signal paths in parallel without any additional need for multiplexing (in this case duplexing) to take place. On the user side of the front end module, first and second contact surfaces for first signal path and second signal path can therefore be connected together and additionally connected to a shared antenna. Hence on the underside of the module substrate only two contact surfaces are required as an antenna-side input for RF signals.

In one embodiment, a filter circuit is arranged in each of the two signal paths. This filter circuit is designed to prevent unwanted frequency components from getting through the respective signal path. The filter circuit can be designed as a band-pass filter, high-pass filter or low-pass filter.

The filter circuit can be implemented by a suitable connection of passive components selected from capacitors, inductors and resistors. It is also possible, however, to implement at least one of the filter circuits in the form of a discrete chip component that works with acoustic waves. It is preferred, however, to implement the filter circuit from passive circuit elements, which are integrated at least partially in the module substrate. For this purpose, the module substrate has a multilayer construction and comprises patterned metallization layers arranged between dielectric layers and in which the various components are implemented.

In a further embodiment, an impedance matching circuit is arranged in each signal path. This circuit matches the impedance at the respective signal-path output to the impedance of a subsequent stage. The subsequent stage can be in particular an amplifier or generally an RF IC, in particular a transceiver, in which amplifier circuits, signal generating circuits and signal receiving circuits are combined.

According to one embodiment, each of the two signal paths are provided on the antenna side with a protective circuit, which can harmlessly divert away ESD signals introduced from the antenna. A protective circuit of this type comprises at least one protective element that has a parallel path connected to ground.

The front end module is preferably constructed on a multilayer module substrate in which at least some of the circuits mentioned are integrated, said circuits being selected from filter circuit, phase matching circuit, multiplexer circuit, impedance matching circuit and protective circuit.

The front end module comprises at least two signal paths on the module substrate. It is also possible, however, to provide one or more additional signal paths, which are designed for a third frequency range or additional frequency ranges. The front end module can handle an additional wireless standard via the additional signal path and hence be equipped for an additional transmit or receive operating mode.

In one embodiment, the first signal path is designed to receive satellite signals, and the second signal path is designed to transmit and receive Bluetooth or WLAN signals. The satellite signals can include the GPS signal, for example. Bluetooth and WLAN signals use a shared frequency range, and therefore a shared signal path is sufficient for both types of signals. The Bluetooth and WLAN separation can take place in a subsequent stage, which only requires logic-based and not frequency-based separation of the signals.

As already mentioned, the front end module can be operated in different circuit environments having different numbers of antennas. To operate in a circuit environment, the module substrate is connected to the respective circuit environment via the contact surfaces of said module substrate arranged on the underside. For the first operating mode, the first contact surface is connected to a first diversity antenna, and the second contact surface is connected to a second diversity antenna.

For operation of the front end module in a circuit environment according to the second operating mode, i.e., in multiplex operating mode, the first contact surface for the first signal path is connected to the contact surface for the first output of the multiplexer. Likewise, the second contact surface of the second signal path is connected to the contact surface of the second output of the multiplexer. Both connections are made on the user side by suitable RF lines or signal conductors, which are hence arranged outside the module substrate. The signal connection is made by connecting the contact surface for the multiplexer input to a shared antenna, which is likewise part of the external circuit environment.

In the additional embodiment mentioned for multiplex operation, the first contact surface and second contact surface for first signal path and second signal path are connected to one another outside the module substrate via a signal conductor provided there. In addition, the two contact surfaces are connected to a shared antenna in parallel.

BRIEF DESCRIPTION OF THE DRAWINGS

The front end module and the operating methods are described in greater detail below with reference to exemplary embodiments and the associated figures. The figures are only schematic diagrams from which it is not possible to infer actual proportions. Details that do not help the understanding of the invention may also be omitted in the figures.

FIG. 1 shows a schematic cross-section of a front end module according to a first embodiment;

FIG. 2A shows the front end module in a second circuit environment;

FIG. 2B shows the front end module in a first circuit environment;

FIG. 3 shows a schematic cross-section of a front end module according to a second embodiment;

FIG. 4A shows the front end module in a second circuit environment;

FIG. 4B shows the front end module in a first circuit environment; and

DETAILED DESCRIPTION OF ILLUSTRATIVE EMBODIMENTS

Figure 5A:
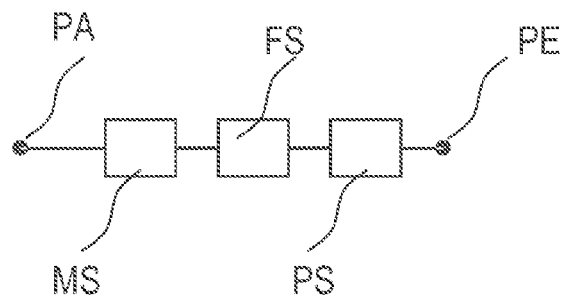
FIGS. 5A to 5C show examples of components that can be connected in a signal path.

FIG. 1 shows a schematic cross-section of a first exemplary embodiment of a front end module. The front end module is formed on a module substrate MS, which is preferably a multilayer substrate and in particular a ceramic multilayer substrate. In one embodiment, the module substrate MS is formed as an LTCC (LTCC=low temperature co-fired ceramic) which is preferably sintered with low distortion and comprises patterned metallization layers arranged between dielectric layers and in which passive components are implemented. Hence, some of the components can be formed in the module substrate MS. It is also possible to arrange the circuit components entirely or partially on the surface of the module substrate.

A first signal path SP1 and a second signal path SP2 are provided in this embodiment. These are used for signal transmission of RF signals and are therefore designed accordingly. Various components can be, but do not have to be, connected in the respective signal path SP. First signal path SP1 and second signal path SP2 are respectively connected on the input side (antenna side) to a first contact surface AF1 and a second contact surface AF2 on the underside of the module substrate MS.

In addition, a multiplexer circuit MPX is provided, which likewise can be integrated partially or entirely in the module substrate MS. The multiplexer circuit MPX comprises three terminals, which are each connected to a contact surface on the underside of the module substrate. One contact surface AM1 is connected to the first output of the multiplexer circuit, one contact surface AM2 is connected to the second output of the multiplexer circuit and one contact surface EM is connected to the input of the multiplexer circuit MPX.

Further circuit components and in particular active semiconductor circuits in the form of discrete components, which are used for signal processing of the RF signal, can be arranged on the module substrate MS. Examples of these are amplifier circuits or RF ICs, known as transceivers, in which signal modulation, signal generation, signal amplification or generally signal processing can take place at the digital or analog level. These integrated circuit components can be connected to both signal paths and thus process the signals from both signal paths and hence from both frequency ranges.

FIG. 2A shows the front end module depicted in FIG. 1 in a second circuit environment PB2, which can be implemented, for example, on a printed circuit board or generally on a circuit board. In this second circuit environment, all five contact surfaces AF, AM and EM of the front end module are in contact with the second circuit environment.

A first signal line SL1 in the second circuit environment PB2 connects the first output of the multiplexer circuit MPX to the first contact surface AF1, which is connected to the input of the first signal path SP1. In a similar manner, a second signal line SL2 connects the second output AM2 of the multiplexer circuit MPX to the second contact surface AF2, which is connected to the antenna-side input of the second signal path SP2. The multiplexer input EM of the front end module is connected to a shared antenna GA.

In this second circuit environment, the multiplexer circuit MPX is used to assign RF signals received via the shared antenna GA to the first or second signal path SP according to whether the frequency of the received RF signal lies in the first or second frequency range. Here, each of the signal paths SP can carry RF signals from the antenna to a subsequent stage or convey RF signals from a subsequent stage to the antenna (shared antenna).

FIG. 2B shows the front end module depicted in FIG. 1 in a first circuit environment PB1, which can likewise be implemented on a circuit board. In this case, the front end module can be operated in a first operating mode by the first contact surface AF1 being connected in the first circuit environment to a first diversity antenna DA1, while the second contact surface, which is connected to the antenna-side input of the second signal path SP2, is connected to a second diversity antenna DA2.

In this embodiment, each signal path can carry RF signals via its dedicated antenna independently of the other signal path. Contact does not need to be made with the multiplexer circuit MPX, which remains without function in this operating mode.

FIG. 3 uses a schematic cross-section to show a further exemplary embodiment of a front end module in which the multiplexer circuit is dispensed with. The "multiplex operating mode" is provided by a first phase matching circuit PS1 and a second phase matching circuit PS2, which are each arranged in the respective signal path SP on the antenna side. The effect of the phase matching circuit PS is that in the signal path concerned, the phase of RF signals that lie in the respective other frequency range is rotated to Open, and therefore the phase matching circuit EF is blocked for the corresponding signal. This ensures that only signals in the relevant frequency range can enter the respective signal path SP, whereas signals in the other frequency range cannot pass through the signal path SP. Hence, a multiplexer circuit can be dispensed with because its functions are alternatively implemented by the phase matching circuits arranged in the two signal paths.

FIG. 4A shows the front end module depicted in FIG. 3 in a second circuit environment PB2, which again can be implemented on a circuit board. In the second circuit environment, first contact surface AF1 and second contact surface AF2 are connected by means of a signal line SL. A shared antenna GA is also connected to the signal line. Thus, both signal paths SP1, SP2 are connected to the shared antenna GA in parallel.

FIG. 4B shows the front end module in a first circuit environment PB1, which can be implemented in a circuit board. The first contact surface is connected to a first diversity antenna DA1 via a signal line in this circuit board. The second contact surface AF2 is connected to the second diversity antenna DA2 via a further signal line. The antennas can be designed so that they receive and transmit RF signals in the respective frequency range with low losses, i.e., high efficiency. Hence, using the front end module, a first operating mode is possible in the circuit environment comprising two diversity antennas.

FIG. 5A shows possible components that can be connected in a signal path SP. The respective signal path connects an antenna-side signal-path input PE to a signal-path output PA. A phase matching circuit PS can be provided as the first component arranged on the antenna side in the signal path SP. A filter circuit FS is arranged in series therewith, which filters out unwanted frequency components from the carried RF signal. An impedance matching circuit MS can be provided between filter circuit FS and signal-path output PA. This circuit is used to match the impedance of the signal path to the impedance of a subsequent stage. This impedance can take any value but is preferably matched to a standard impedance of 50 Ohms.

Figure 5B:
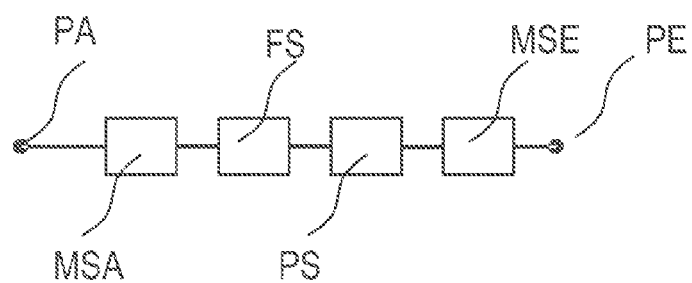

FIG. 5B shows further components that can be arranged in the signal path SP. An input-side impedance matching circuit MSE is provided on the antenna side as the first component. The phase matching circuit PS follows as the next component in the signal path. This circuit is connected on the output side to a filter circuit FS, which in turn is connected on the output side to the output-side impedance matching circuit MSA.

It is also possible to implement phase matching circuit PS and impedance matching circuit MSE in the form of a single piece of circuitry that performs both functions, namely suitable phase rotation and suitable impedance matching. Likewise, the filter circuit FS can be designed to transform the impedance and, for example, increase it to twice the original value or generally to a multiple of the original value, or to reduce it to the relevant fraction.

Figure 5C:
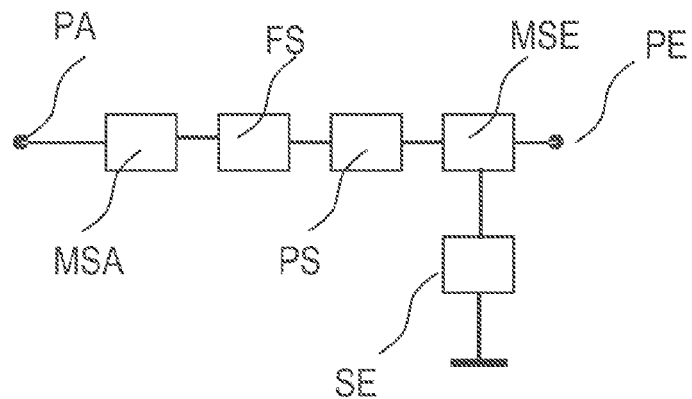

FIG. 5C shows as an additional component a protective element SE, which is preferably connected to ground on the input side in a path parallel to the signal path. This protective element SE can constitute part of a protective circuit or realize a protective circuit. The simplest exemplary embodiment of a protective element is an inductor connected to ground, which harmlessly diverts to ground in particular high-frequency signals, as are typical of ESD interference. It is also possible, however, to use other protective elements SE, for example varactor diodes or non-linear elements.

Again in this case, the protective element can be integrated in the impedance matching circuit MSE and/or the phase matching circuit PS.

It is also possible to combine in a different manner the components of the signal path SP that are shown in FIGS. 5A to 5C.

The signal paths SP of front-end circuits according to the invention are therefore not limited to the components shown and may comprise any further components or even fewer components or no components at all so long as the signal path SP is designed to carry RF signals.

The invention is not limited to the exemplary embodiments shown in the figures or explained with reference to the figures. According to the number and nature of the components arranged on the module substrate MS, as many contact surfaces as required can be provided on the module underside, some or all of which can be connected to the respective circuit environment. Signal paths and multiplexer circuits are also possible that are entirely integrated in the module substrate MS so that the module substrate does not need to have any components on the surface.

The invention claimed is:

1. A front end module constructed on or in a module substrate, the front end module comprising:
   a first signal path that can be operated in a first frequency range and that connects a first antenna input to a first signal-path output;
   a second signal path that can be operated in a second frequency range and that connects a second antenna input to a second signal-path output;
   a first contact surface and a second contact surface on an underside of the module substrate, the first contact surface being coupled to the antenna input of the first signal path and the second contact surface being coupled to the antenna input of the second signal path;
   wiring within the module substrate that is designed so that, in a first operating mode, a first diversity antenna can be coupled to the first contact surface, and a second diversity antenna can be connected to the second contact surface; and
   a further connection element between the first and second signal paths for use in a multiplex operating mode, the further connection element configured to couple the first and second signal paths to a shared antenna.

2. The front end module according to claim 1, further comprising:
   a multiplexer circuit disposed on or in the module substrate, the multiplexer circuit comprising a multiplexer input, a first output and a second output, wherein the multiplexer input, the first output and the second output are each coupled to a separate contact surface on the underside of the module substrate.

3. The front end module according to claim 2, wherein the multiplex operating mode can be provided by
   connecting the first contact surface to the contact surface of the first output,
   connecting the second contact surface to the contact surface of the second output, and
   connecting the contact surface of the multiplexer input to a shared antenna.

4. The front end module according to claim 1, wherein each of the first and second signal paths comprises on an antenna side a phase matching circuit, the effect of which is that, in the signal path concerned, the phase of RF signals in the respective other frequency range is rotated to "open" and hence the RF signals are blocked, thereby making a multiplex operating mode possible without additional multiplexers.

5. The front end module according to claim 1, further comprising a filter circuit arranged in the first signal path.

6. The front end module according to claim 5, further comprising a second filter circuit arranged in the second signal path.

7. The front end module according to claim 1, further comprising an impedance matching circuit arranged in the first signal path, the impedance matching circuit configured to match the impedance at the first signal-path output to the impedance of a subsequent stage.

8. The front end module of claim 7, further comprising a second impedance matching circuit arranged in the second signal path.

9. The front end module according to claim 1, further comprising an ESD protection circuit arranged in the first signal path adjacent to the antenna input.

10. The front end module according to claim 9, further comprising a second ESD protection circuit arranged in the second signal path.

11. The front end module according to claim 1, further comprising circuits arranged in the first and second signal paths, the circuits implemented as passive elements and integrated in the module substrate.

12. The front end module according to claim 11, wherein the circuits comprise one or more circuits selected from the group consisting of filter circuits, phase matching circuits, multiplexer circuits, impedance matching circuits and ESD protection circuits.

13. The front end module according to claim 1, further comprising a transceiver IC mounted on the module substrate and coupled to the first and second signal-path outputs.

14. The front end module according to claim 1, further comprising an additional signal path designed for a third frequency range, the additional signal path implemented on or in the module substrate.

15. The front end module according to claim 1, wherein the first signal path is designed to receive satellite signals and the second signal path is designed to transmit and receive Bluetooth or WLAN signals.

16. A method for operating a front end module according to claim 1 in a first circuit environment in the first operating mode;
   wherein the module substrate is coupled to a circuit environment via contact surfaces arranged on the underside of the module substrate; and
   wherein the first contact surface is coupled to a first diversity antenna, and the second contact surface is coupled to a second diversity antenna.

17. A method for operating a front end module according to claim 3 in a second circuit environment in the multiplex operating mode;
   wherein the first contact surface is coupled to the contact surface of the first output of the multiplexer, and wherein the second contact surface is coupled to the contact surface of the second output of the multiplexer;
   wherein these connections are made by signal conductors arranged outside the module substrate; and
   wherein the contact surface of the multiplexer input is connected to a shared antenna.

18. A method for operating a front end module according to claim 4 in a second circuit environment in the multiplex operating mode;
   wherein the first contact surface and the second contact surface are both coupled directly to one another and to a shared antenna; and
   wherein these connections are made by signal conductors arranged outside the module substrate.

* * * * *